United States Patent
Grandin et al.

(10) Patent No.: US 10,852,388 B2
(45) Date of Patent: Dec. 1, 2020

(54) METHOD AND DEVICE FOR LOCATING AN ELECTROMAGNETIC EMISSION SOURCE AND SYSTEM IMPLEMENTING SUCH A METHOD

(71) Applicant: THALES, Courbevoie (FR)

(72) Inventors: Jean-François Grandin, Elancourt (FR); Hugo Seute, Elancourt (FR); Raphaël Sperling, Elancourt (FR); Laurent Ratton, Elancourt (FR)

(73) Assignee: THALES, Courbevoie (FR)

( * ) Notice: Subject to any disclaimer, the term of this patent is extended or adjusted under 35 U.S.C. 154(b) by 448 days.

(21) Appl. No.: 15/577,295

(22) PCT Filed: Jun. 13, 2016

(86) PCT No.: PCT/EP2016/063521
§ 371 (c)(1),
(2) Date: Nov. 27, 2017

(87) PCT Pub. No.: WO2016/202748
PCT Pub. Date: Dec. 22, 2016

(65) Prior Publication Data
US 2018/0149729 A1 May 31, 2018

(30) Foreign Application Priority Data

Jun. 17, 2015 (FR) .................................... 15 01253

(51) Int. Cl.
*G01S 7/02* (2006.01)
*G01S 5/02* (2010.01)
(Continued)

(52) U.S. Cl.
CPC .......... *G01S 7/021* (2013.01); *G01R 29/0814* (2013.01); *G01S 5/0268* (2013.01); *G01S 5/12* (2013.01)

(58) Field of Classification Search
CPC ..... G01S 1/02; G01S 5/02; G01S 5/04; G01S 5/0009; G01S 5/12; G01S 5/0268; G01S 7/021; G01R 29/0814; H04W 64/00
(Continued)

(56) References Cited

U.S. PATENT DOCUMENTS 5,999,129 A 12/1999 Rose
7,440,762 B2 * 10/2008 Maloney .................. G01S 19/09
455/456.1
(Continued)

FOREIGN PATENT DOCUMENTS

FR 2 999 297 A1 6/2014

OTHER PUBLICATIONS

A.H. Quazi "An overview on the time delay estimate in active and passive systems for target localization," IEEE Transactions on Acoustics, Speech, and Signal Processing, vol. ASSP-29, No. 3, Jun. 1981, pp. 527-533.
(Continued)

*Primary Examiner* — Harry K Liu
(74) *Attorney, Agent, or Firm* — BakerHostetler (57) ABSTRACT

A method using an array of ESM receivers comprises; a step of determining a first locus on the basis of a first measurement giving information on the angle difference of arrival of the emission beam on two receivers, the first locus including the points in space giving the same first measurement on the two receivers; a step of determining a second locus on the basis of a second measurement giving information on the direction of arrival on at least one receiver, the second locus including the points in space giving the same second measurement on the receiver; and a step of determining a third locus on which the position of the source is found, the third locus being the intersection of the first locus and of the second locus.

9 Claims, 4 Drawing Sheets

(51) Int. Cl.
*G01S 5/12* (2006.01)
*G01R 29/08* (2006.01)

(58) Field of Classification Search
USPC .......................................................... 342/450
See application file for complete search history.

(56) References Cited

U.S. PATENT DOCUMENTS

| | | | |
|---|---|---|---|
| 2003/0001777 A1* | 1/2003 | Johnson | G01S 5/12 342/387 |
| 2008/0186235 A1 | 8/2008 | Struckman et al. | |
| 2010/0138184 A1* | 6/2010 | Fernandez | G01S 5/02 702/150 |
| 2011/0074631 A1* | 3/2011 | Parker | G01S 5/16 342/378 |
| 2012/0252503 A1* | 10/2012 | Wu | H04W 64/00 455/456.6 |
| 2013/0021199 A1* | 1/2013 | Fix | G01S 5/0263 342/357.43 |
| 2016/0061932 A1* | 3/2016 | May | G01S 5/02 342/451 |

OTHER PUBLICATIONS

A.G. Piersol, "Time delay Estimation Using Phase Data," IEEE Transactions on Acoustics, Speech, and Signal Processing, vol. ASSP-29, No. 3, Jun. 1981, pp. 471-477.

* cited by examiner

METHOD AND DEVICE FOR LOCATING AN ELECTROMAGNETIC EMISSION SOURCE AND SYSTEM IMPLEMENTING SUCH A METHOD

CROSS-REFERENCE TO RELATED APPLICATIONS

This application is a National Stage of International patent application PCT/EP2016/063521, filed on Jun. 13, 2016, which claims priority to foreign French patent application No. FR 1501253, filed on Jun. 17, 2015, the disclosures of which are incorporated by reference in their entirety.

FIELD OF THE INVENTION

The present invention relates to a method for locating an electromagnetic source. The invention also relates to a processing device able to implement this method. It also relates to a system implementing this method.

BACKGROUND

Summary of the Invention

The invention is applicable to many situations. It may in particular be applied to determine a tactical situation, i.e. to locate the emissions of slowly or rapidly moving mobile or stationary radars in ground, sea or air contexts on the basis of an array of fixed or mobile radar detectors (the abbreviation ESM, for Electronic Support Measure, is used below to mean a radar detector) located on ground or sea vehicles or drones, airplanes or helicopters. In particular, the invention may be used:

In a maritime context, for coastal monitoring by an array of ESM stations on the coast;
In a ground context, for example to monitor a swarm of drones;
In an air context, for example to map the path of air threats using an array of ESMs borne by an airplane.

In conventional methods, location relies on iterative gradient-based maximum-likelihood-estimation methods requiring stepwise gradient calculations, which are often resource intensive in terms of computational power, or indeed methods requiring the search space to be digitized.

One aim of the invention is in particular to estimate the location of an emission via a direct and non-iterative calculation.

To this end, one subject of the invention is a method for locating a source of an electromagnetic emission on the basis of an array of ESM receivers, said source emitting an emission beam that scans space, said method including:
a step of determining a first locus on the basis of a first measurement giving information on the angle difference of arrival of said emission beam on two receivers, said first locus including the points in space giving the same first measurement on said two receivers;
a step of determining a second locus on the basis of a second measurement giving information on the direction of arrival on at least one receiver, said second locus including the points in space giving the same second measurement on said receiver;
a step of calculating the third locus on which the position of said source is found, said third locus being the intersection of said first locus and of said second locus.

In one particular implementation, said method includes:
a step of taking a measurement of the angle difference of arrival (LA of said emission beam on two receivers, referred to as an ADOA measurement;
a step of calculating what is referred to as an iso-ADOA cylinder on the basis of said ADOA measurement, said iso-ADOA cylinder corresponding to points in space giving the same ADOA measurement for said two receivers;
a step of taking measurements of the time difference of arrival of said emission beam on said two receivers, referred to as TDOA measurements;
a step of calculating what is referred to as an iso-TDOA hyperboloid on the basis of said TDOA measurements, said iso-TDOA hyperboloid corresponding to points giving said same TDOA measurements; and
a step of calculating the intersection of said iso-ADOA cylinder and said iso-TDOA hyperboloid, said intersection comprising the position of said source.

In another particular implementation, said method includes:
a step of taking a measurement of the time difference of passage of said emission beam over two receivers, referred to as a TDLP measurement;
a step of calculating what is referred to as an iso-TDLP cylinder on the basis of said TDLP measurement, said iso-TDLP cylinder corresponding to points in space giving the same TDLP measurement for said two receivers;
a step of taking measurements of the time difference of arrival of said emission beam on said two receivers, referred to as TDOA measurements;
a step of calculating what is referred to as an iso-TDOA hyperboloid on the basis of said TDOA measurements, said iso-TDOA hyperboloid corresponding to points giving said same TDOA measurements; and
a step of calculating the intersection of said iso-ADOA cylinder and said iso-TDOA hyperboloid, said intersection comprising the position of said source.

Said cylinder is for example calculated in two dimensions corresponding to a given altitude, the calculation then corresponding to the calculation of a circle, the position of said source being the intersection of said circle and said iso-TDOA hyperboloid.

The ESM sensors are for example borne by an aircraft.

Said array for example includes a single ESM sensor, the measurements being carried out at two consecutive positions of said sensor.

Said source being mobile, the step of calculating the position of said source at a given time is for example followed by a step of Kalman filtering and of predicting positions of said moving target.

The invention also relates to a processing device able to communicate with an array of ESM sensors, said device being able to implement the method such as described above.

The invention also relates to a system for locating a source of an electromagnetic emission including at least one array of ESM sensors and processing means implementing said method.

BRIEF DESCRIPTION OF THE DRAWINGS

Other features and advantages of the invention will become apparent from the following description, which is given with reference to the appended drawings, which show.

DETAILED DESCRIPTION

Figure 1A:
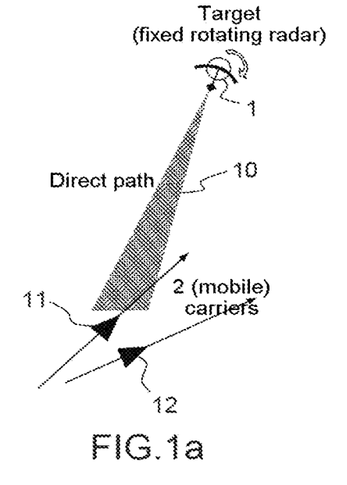
FIGS. 1a and 1b, an illustration of contexts of application of the invention.
Figure 1B:
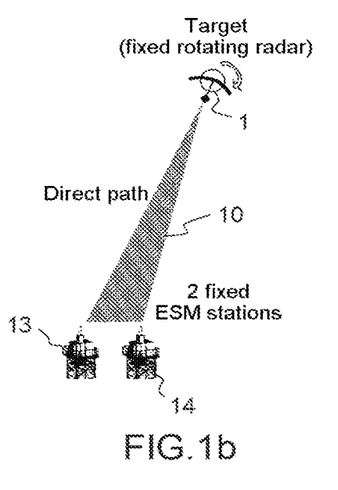

FIGS. 1a and 1b illustrate contexts of application of the invention. FIG. 1a shows a target 1 producing an emission 10. In the example of FIG. 1a, the target 1 is a rotating radar. Two ESMs are carried by two mobile carriers 11, 12, each carrier being equipped with one ESM. FIG. 1b illustrates the same configuration but with two fixed ESMs 13, 14.

The invention relates to the location of a fixed emission with two fixed or mobile ESM stations. However, it may be applied with a single moving ESM station.

The invention may also be applied to a slowly or rapidly moving mobile emission, insofar as, since the estimation is carried out on a lobe passage, the successive positions may then be filtered using many conventional methods including a Kalman filter. A sequence of positions integrated by the filtering is then obtained with a reconstruction of the velocity of the target.

Figure 2:
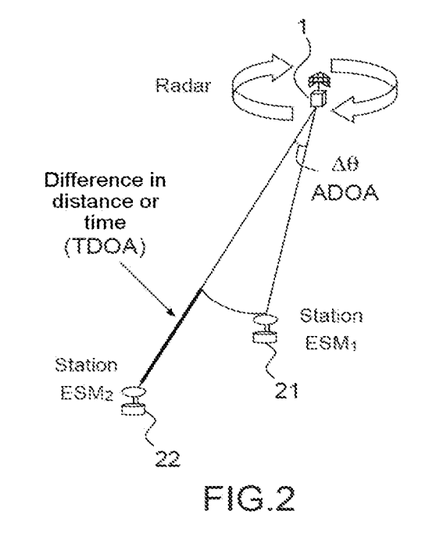
FIG. 2, an illustration of the type of measurements used.

FIG. 2 illustrates the two types of measurements used. Two types of measurements will be considered:
  measurements of angle difference of arrival (ADOA) quantifying the difference $\Delta\theta$ in the angle of arrival of the radar emission on two remote ESM receivers 21, 22;
  measurements of time difference of arrival (FDOA), giving an indication of direction of arrival.

Below, the two ESM 21, 22 will possibly be called ESM1 and ESM2, respectively.

The ADOA measurement may in particular be obtained via the various following methods:
  a measurement of TDLP (time difference of lobe passage) for radars scanned at constant speed $\omega$ over the space between the two ESMs;
  a calculation of the difference, between the two ESMs, in two (sufficiently precise) direct angular measurements obtained by goniometry at each ESM, on the basis of AOA measurements obtained, for example on a single airplane, via an amplitude-measuring, phase-measuring or short-baseline-TDOA goniometric device;
  an LBPDE (long-baseline phase-difference evolution) angular variation measurement on a single moving airplane using a long interferometry baseline;
  a measurement of frequency difference of arrival (FDOA) taken on a single moving ESM or between two ESMs provided they are moving relative to the source.

DOA may in particular be measured by measuring the time difference of arrival of the radar pulses on two remote ESM receivers 21, 22 corresponding to two carrier airplanes.

These two measurements, although not corresponding to the same equations, give the equivalent, to the first order, of a DOA measurement, TDOA measurements being a priori more precise than AOA measurements.

For certain envisioned combinations of measurement, the method applies to radar emissions of a particular type. For example, the TDLP measurement applies to radars scanned at a constant speed. The measurement of FDOA with a single ESM receiver for its part applies to coherent waveforms.

The invention will be described in the following particular context:
  the ADOA measurement results from the measurement of TDLP (time difference of lobe passage) and from the measurement or knowledge of the scanning speed $\omega$ of the radar emission, which is assumed to be almost constant over the space between the remote ESMs. The TDLP measurement may be obtained by considering the difference in the LPTs (lobe passage times) of the same lobe over the two ESMs;
  the TDOA measurement results from the difference in the times of arrival of the radar emission on the two remote ESMs.

Figure 3:
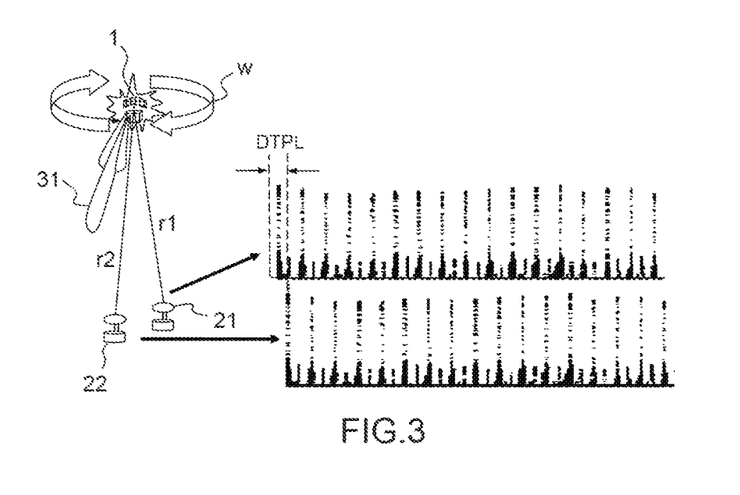
FIG. 3, an illustration of a TDLP measurement i.e. measurement of the time difference of lobe passage of emission.

FIG. 3 illustrates the TDLP measurement. This time-difference-of-lobe-passage measurement is the difference in passage time T of the emission of a radar that is scanned at the speed $\omega$ over two fixed stations. The example of FIG. 3 is nonlimiting and the same equations apply, to the first order, even for rapidly moving sources. The following situation is assumed:
  a radar 1 emits while scanning space at a speed of rotation $\omega$ that is assumed to be constant and known;
  the main lobe 31 is observed to pass over two ESM stations 21, 22. The times at which the main lobe passes over the first ESM, ESM1, and over the second ESM, ESM2, are $t_1$ and $t_2$, respectively.

The time difference of lobe passage (TDLP) is given by $\Delta T_{12}$ in the following equation:

$$\Delta T_{12} = t_1 - t_2 = \frac{\Delta\theta}{\omega} + \frac{r_1 - r_2}{c} + n_{12} \qquad (1)$$

where $\Delta\alpha$ is the angle difference of arrival $\Delta\theta$ of the radar emission on the two remote receivers 21, 22, $r_1$ and $r_2$ being the respective distances of these two receivers to the radar, $n_{12}$ is a noise assumed to be Gaussian and of standard deviation of 1 to 5 ms. The time of passage of the lobe may be obtained with this precision by integration over the successive lobes.

The measurement of the time difference of arrival on the two remote observers 21, 22 is also considered. Measurement techniques used in radar and EW have in particular been described in the article by A. H. Quazi "An overview on the time delay estimate in active and passive systems for target localization" IEEE ASSP-29, No 3, June 1981, pages 527-533. The technique used consisting in seeking the peak of the intercorrelation function is moreover presented in the article by A. G. Piersol, "Time delay Estimation Using Phase Data", IEEE ASSP-29, N0 3, June 1981, pages 471-477. There are a plurality of other competing techniques including a technique using the phase of the Fourier transform of the intercorrelation function.

It will be noted that:

$$TDOA = \frac{r_1 - r_2}{c}.$$

The time difference of arrival (TDOA) corresponds to the time difference taken by the radar waves to travel $r_1$ and $r_2$.

Given that c is about $3 \times 10^8$ m/s, this corresponding to a distance of 300 km traveled in 1 ms, the term $$\frac{r_1 - r_2}{c}$$

is negligible with respect to $n_{12}$ in equation (1) of the TDLP, because $n_{12}$ is about 1 ms and the distance between the stations 21, 22 is about 3 km. The term $$\frac{r_1 - r_2}{c}$$

may therefore be neglected in the solution.

Finally, to the first order, the time difference of lobe passage is:

$$\Delta T = \frac{\Delta \theta}{\omega} \quad (2)$$

Two measurements given by the following equations are therefore obtained:

a measurement of the time difference of arrival TDOA:

$$TDOA = \frac{r_1 - r_2}{c};$$

and a measurement of the time difference of lobe passage TDLP: $\Delta \theta = \omega \cdot \Delta T$.

The location is determined by finding the values of the position of the emission that simultaneously satisfy these two equations.

Below, the expression "ESM lobe" will be understood to mean a set of pulses resulting from what is called a "de-interlacing" operation carried out in parallel by each ESM, which consists in seeking to group together all the pulses generated by the same radar and corresponding to a single lobe passage.

On the basis of the pulses of each lobe, for each ESM station 21, 22, the following are calculated:

a quadruplet of measurements $(TOA_k, LPT_k, LLA_k, Lev_k)_i$ summarizing the geometric parameters of the lobe, the precise position of the ESMs 21, 22 moreover being assumed to be known; and a radioelectric description of the perceived waveform (list of the PRPs, frequencies and PD mainly).

These lobes are then tracked locally by each ESM via a method using:

similarities between the radioelectric descriptors;

the proximity of the TDOAs; and the regularity of the lobe passage times LPTs.

The present invention does not relate either to the de-interlacing function, or to the function used to characterize the lobes, or to the function used to associate lobes in a single platform, or to the function used to identify the emission. These operations are known and moreover assumed to be carried out.

Nonlimitingly, the elementary location delivered on one lobe passage may be integrated via any type of technique for tracking sequences of emission lobes over time.

Figure 4:
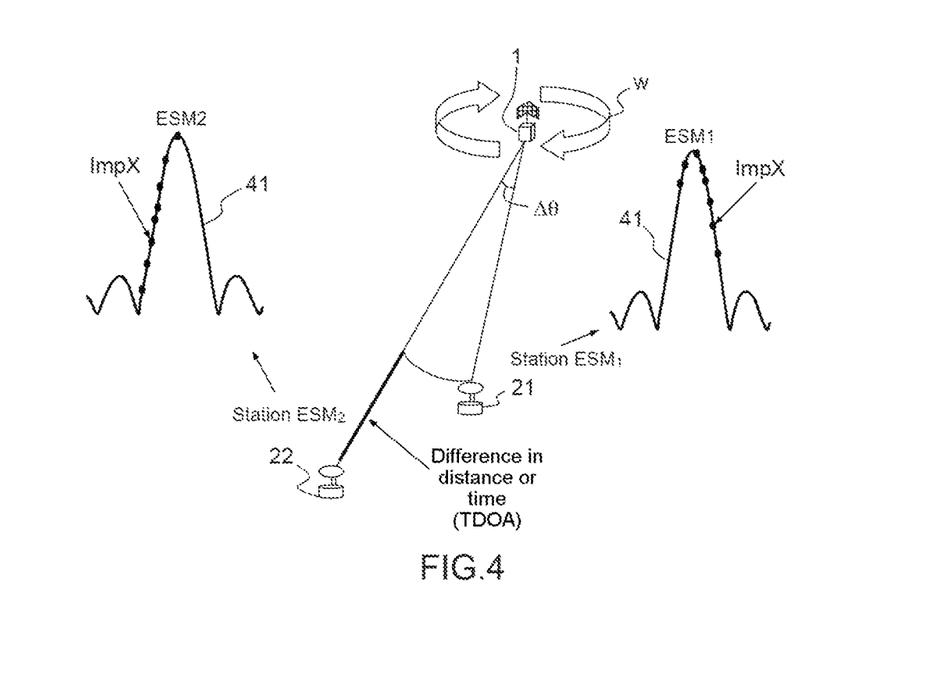
FIG. 4, a representation of one scanned radar lobe intercepted by two ESM receivers.

FIG. 4 shows the lobe 41 of the scanned radar 1 intercepted by the two ESMs, ESM 1 and ESM 2.

These two ESMs intercept the same pulses ImpX but with different levels that are related to the irradiation function of the radar, and with a time difference related to the TDOA. In the general case, the temporal sequence of the pattern of pulses is independent of how the lobe of the radar varies as a function of time. This amounts to stating the independence of the TDLP and TDOA measurements.

In this application, the following steps are carried out in the locating method:

For each ESM i.

For each intercepted lobe k, calculation of a quadruplet of measurements $(TOA_k, LPT_k, LL_k, Lev_k)_i$ summarizing the geometric parameters of the lobe 41, this lobe also being characterized by a summary of the characteristics of the WF (PRP, frequencies, PD, intra-pulse codes, etc.).

For each pair of ESM stations:

Association of the lobes of the same emission between the platforms;

Estimation of the scanning speed $\omega$ of the radar or of the period of rotation of the antenna (ARP) of the radar 1 via conjoint estimation, or by virtue of knowledge of the rotation period (ARP) by virtue of ESM identification;

Calculation of the resulting TDLP circle;

Estimation of the TDOA by integration of the TDOAs of the pulses received by the 2 ESMs, this integration possibly being carried out by various methods including correlating the pulse trains received by the two receivers or by simply taking the mean of the various times of arrival (TOAs) of the pulses received by the 2 ESMs;

Calculation of the resulting TDOA hyperboloid.

For all of the ESM Stations:

Calculation of the location by intersection of the TDLP circles and TDOA hyperbolas; and If two stations are used, calculation of the intersection of the TDLP circle and of the TDOA hyperbola.

It is at this point of the location processing, for all of the ESM stations, that the invention is applied.

The determination of the location according to the invention is described only in the context of TDOA and TDLP measurements but the invention is also applicable to all of the systems described above. These systems all determine location on the basis of an angle or direction measurement (here the TDOA) and of a measurement of angular difference (here the TDLP).

Figure 5:
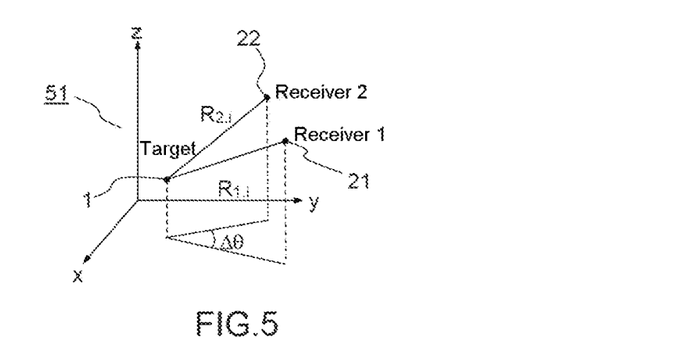
FIG. 5, a representation of the positions of a target and two ESM receivers in an orthogonal coordinate system.

FIG. 5 shows the target 1 and two ESM receivers 21, 22 in a coordinate system O, x, y, z at the time of an $i^{th}$ measurement, i being comprised between 1 and N. Specifically, two observers 21, 22 perform N measurements of TDOA (time difference of arrival of a given signal on the two remote sensors 21, 22) and TDLP (time difference of lobe passage) on the stationary target 1. The TDOA and TDLP measurements between the first receiver 21 and the second receiver 22 are denoted $t_i$ and $d_i$, respectively. Furthermore, the respective distances of the first and second receiver to the target are denoted $R_{1,i}$ and $R_{2,i}$. In the coordinate system 51, the coordinates of the target, of the first receiver and of the second receiver on the $i^{th}$ measurement are respectively:

$$(x_e, y_e, z_e), (x_{1,i}, y_{1,i}, z_{1,i}), (x_{2,i}, y_{2,i}, z_{2,i}).$$

The TDLP measurements correspond to the following explicit measurement equations:

$$\forall i \in [\![1, N]\!], d_i = \frac{PRA}{2\pi} \times \Delta\theta = \frac{PRA}{2\pi}\left(\arctan\left(\frac{y_e - y_{2,i}}{x_e - x_{2,i}}\right) - \arctan\left(\frac{y_e - y_{1,i}}{x_e - x_{1,i}}\right)\right).$$

The TDOA measurements correspond to the following explicit measurement equations:

$$\forall i \in [\![1, N]\!], t_i = \frac{R_{2,i} - R_{1,i}}{c} = \frac{\sqrt{(x_e - x_{2,i})^2 + (y_e - y_{2,i})^2 + (z_e - z_{2,i})^2} - \sqrt{(x_e - x_{1,i})^2 + (y_e - y_{1,i})^2 + (z_e - z_{1,i})^2}}{c}$$

Figure 6A:
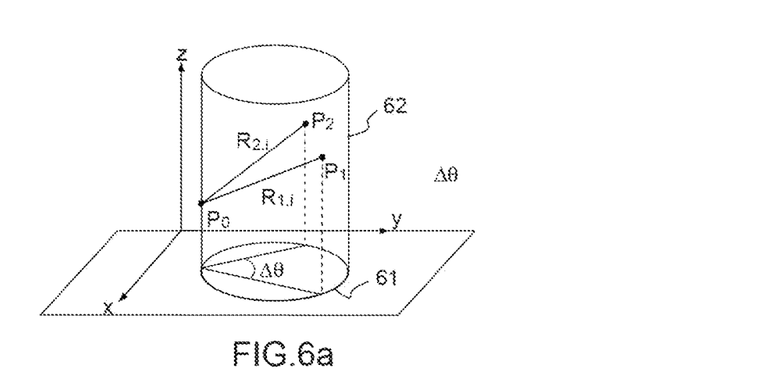
FIGS. 6a and 6b, an example of a locus used in the implementation of the invention, i.e. a cylinder in this example.

According to the inscribed angle theorem, the points giving the same TDLP measurement for the given positions of the receivers are located on a cylinder 61 referred to as an iso-TDLP circle, which is illustrated in FIG. 6a. This cylinder contains the positions $P_1$, $P_2$ of the receivers 21, 22 and the position Pe of the target 1.

Figure 6B:
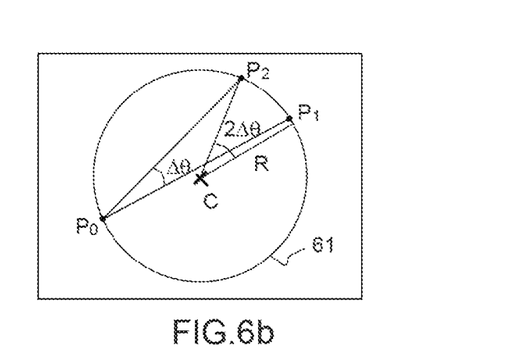

With reference to FIG. 6b, C being the center of the base circle 62 of the cylinder, according to the inscribed angle theorem, the angle $\widehat{P_1 C P_2}$ is equal to twice the angle $\Delta\theta$ obtained on the basis of the TDLP measured between the receivers 21, 22, where $$\Delta\theta = \frac{2\pi}{PRA} \times TDLP.$$

In addition, by definition of the radius R of the circle, the distances between C and $P_1$ and between C and $P_2$ are equal, i.e. C is the bisector of the segment $[\overrightarrow{P_1 P_2}]$, denoted bisc$[\overrightarrow{P_1 P_2}]$ The following system is therefore obtained, denoting M the middle of the segment $[\overrightarrow{P_1 P_2}]$:

$$\begin{cases} C \in bisc[\overrightarrow{P_1 P_2}] \\ \widehat{P_1 C P_2} = 2\Delta\theta \end{cases} \Leftrightarrow \begin{cases} \overrightarrow{MC} = k\begin{pmatrix} y_1 - y_2 \\ x_2 - x_1 \end{pmatrix} \\ MC = \frac{MP_1}{\tan\Delta\theta} \end{cases} \Leftrightarrow$$

$$\begin{cases} \overrightarrow{MC} = k\begin{pmatrix} y_1 - y_2 \\ x_2 - x_1 \end{pmatrix} \\ k \times d_{12} = \frac{d_{12}}{2\tan\Delta\theta} \end{cases} \Leftrightarrow \begin{cases} x_C = x_M + \frac{y_1 - y_2}{2\tan\Delta\theta} \\ y_C = y_M + \frac{x_2 - x_1}{2\tan\Delta\theta} \end{cases}.$$

The radius R of the base circle 62 of the iso-TDLP cylinder is deduced therefrom, $r_{12}$ being the distance between the positions $P_1$ and $P_2$ in the x, y plane:

$$R = \frac{MP_1}{|\sin\Delta\theta|} = \frac{r_{12}}{2|\sin\Delta\theta|} = \frac{\sqrt{(x_1 - x_2)^2 + (y_1 - y_2)^2}}{2|\sin\Delta\theta|}.$$

Finally, the equation of the iso-TDLP cylinder is obtained:

$$(x - x_C)^2 + (y - y_C)^2 = R^2$$

with $$\begin{cases} R = \frac{\sqrt{(x_1 - x_2)^2 + (y_1 - y_2)^2}}{2|\sin\Delta\theta|} \\ x_C = \frac{x_1 + x_2}{2} - \frac{y_2 - y_1}{2\tan\Delta\theta} \\ y_C = \frac{y_1 + y_2}{2} + \frac{x_2 - x_1}{2\tan\Delta\theta} \end{cases}.$$

Figure 7:
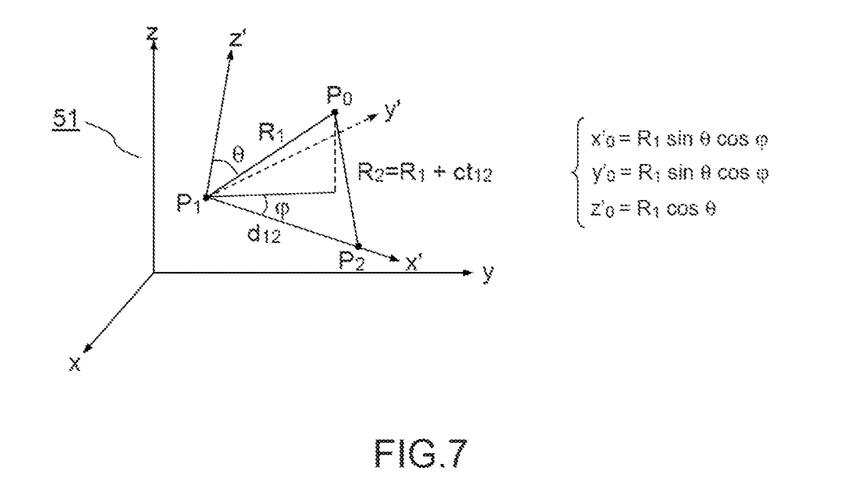
FIG. 7, an example of a change in coordinate system allowing a second locus used in the method according to the invention to be calculated.

The points giving the same TDOA measurement for given receiver positions are located on a hyperboloid referred to as an iso-TDOA hyperboloid, which is obtained by the calculations presented below on the basis of the representation of FIG. 7. The position Pe of the target 1 and the positions $P_1 <$, $P_2 <$ of the receivers 21, 22 are calculated in a new orthogonal coordinate system O', x', y', z' where O' is equal to $P_1$ and where the axis x' passes through $P_1$ and $P_2$. In this coordinate system, the position Pe is given by the coordinates ($x'_e$, $y'_e$, $z'_e$). The respective distances of the first and second receiver 21, 22 to the target are denoted $R_1$, $R_2$, and the distance between these two receivers is denoted $d_{12}$.

Denoting $\varphi$ the angle between the axis x' and the projection of $P_1 Pe$ into the plane x', y' and denoting $\theta$ the angle between the axis z' and $P_1 Pe$:

$x'_e = R_1 \sin\theta \cos\varphi$
$y'_e = R_1 \sin\theta \sin\varphi$
$z'_e = R_1 \cos\theta$ Moreover, $R_2 = R_1 + c \cdot t_{12}$ where $t_{12}$ is the time difference of arrival between the receivers 21 and 22.

According to Pythagoras's theorem:

$$R_2^2 = (d_{12} - x'_e)^2 + (y'^2_e + z'^2_e)$$

i.e.:

$$(R_1 + ct_{12})^2 = (d_{12} - R_1 \sin\theta \cos\varphi)^2 + (R_1 \sin\theta \sin\varphi)^2 + (R_1 \cos\theta)^2.$$

The polar equation of the iso-TDOA hyperboloid is deduced therefrom:

$$R_1(\theta, \varphi) = \frac{d_{12}^2 - c^2 t_{12}^2}{2(c t_{12} + d_{12} \sin\theta \cos\varphi)} = \frac{p}{1 + e \sin\theta \cos\varphi} \text{ with}$$

$$p = \frac{d_{12}^2 - c^2 t_{12}^2}{2c t_{12}} \text{ and } e = \frac{d_{12}}{c t_{12}}.$$

The equation of the hyperboloid is then obtained, in Cartesian coordinates, in the coordinate system (O', x', y', z'), using the formulae $$\begin{cases} x' = R_1 \sin\theta \cos\varphi \\ y' = R_1 \sin\theta \sin\varphi \\ z' = R_1 \cos\theta \end{cases}, \text{ i.e.} \begin{cases} \sin\theta \cos\varphi = \frac{x'}{R_1} \\ R_1 = \sqrt{x'^2 + y'^2 + z'^2} \end{cases}$$

After calculations, the following equation is obtained:

$$\frac{\left(x' - \frac{d_{12}}{2}\right)^2}{a^2} - \frac{y'^2}{b^2} - \frac{z'^2}{b^2} = 1.$$

Setting $$\begin{cases} a = \dfrac{p}{e^2-1} = \dfrac{d_{12}^2 - c^2 t_{12}^2}{2c\, t_{12}} \times \dfrac{c^2 t_{12}^2}{d_{12}^2 - c^2 t_{12}^2} = \dfrac{c\, t_{12}}{2} \\ b = \dfrac{p}{\sqrt{e^2-1}} = \dfrac{d_{12}^2 - c^2 t_{12}^2}{2c\, t_{12}} \times \dfrac{c\, t_{12}}{\sqrt{d_{12}^2 - c^2 t_{12}^2}} = \dfrac{\sqrt{d_{12}^2 - c^2 t_{12}^2}}{2} \end{cases}$$

gives $$\frac{\left(x' - \dfrac{d_{12}}{2}\right)^2}{c^2 t_{12}^2} - \frac{y'^2}{d_{12}^2 - c^2 t_{12}^2} - \frac{z'^2}{d_{12}^2 - c^2 t_{12}^2} = \frac{1}{4}.$$

To continue, it is necessary to express the formulae for passing from the coordinate system (O, x, y, z) to coordinate system (O', x', y', z') (and vice versa). After calculations:

$$\begin{cases} x' = \dfrac{x_2-x_1}{d_{12}}(x-x_1) + \dfrac{y_2-y_1}{d_{12}}(y-y_1) + \dfrac{z_2-z_1}{d_{12}}(z-z_1) \\ y' = \dfrac{y_1-y_2}{r_{12}}(x-x_1) + \dfrac{x_2-x_1}{r_{12}}(y-y_1) \\ z' = -\dfrac{(x_2-x_1)(z_2-z_1)}{d_{12}r_{12}}(x-x_1) - \dfrac{(y_2-y_1)(z_2-z_1)}{d_{12}r_{12}}(y-y_1) + \\ \qquad \dfrac{r_{12}}{d_{12}}(z-z_1) \end{cases}$$

and conversely $$\begin{cases} x = x_1 + \dfrac{x_2-x_1}{d_{12}}x' - \dfrac{y_2-y_1}{r_{12}}y' - \dfrac{(x_2-x_1)(z_2-z_1)}{d_{12}r_{12}}z' \\ y = y_1 + \dfrac{y_2-y_1}{d_{12}}x' + \dfrac{x_2-x_1}{r_{12}}y' - \dfrac{(y_2-y_1)(z_2-z_1)}{d_{12}r_{12}}z' \\ z = z_1 + \dfrac{z_2-z_1}{d_{12}}x' + \dfrac{r_{12}}{d_{12}}z' \end{cases}$$

where $$\begin{cases} r_{12} = \sqrt{(x_1-x_2)^2 + (y_1-y_2)^2} \\ d_{12} = \sqrt{(x_1-x_2)^2 + (y_1-y_2)^2 + (z_1-z_2)^2} \end{cases}$$

In order to simplify the expression of the intersections, the equations of the iso-TDLP cylinder and of the iso-TDOA hyperboloid are written in the coordinate system (O', x', y', z') defined above. After calculations, the following system is obtained:

$$(S)\begin{cases} \left(\dfrac{r_{12}}{d_{12}}x' - \dfrac{z_2-z_1}{d_{12}}z' - \dfrac{r_{12}}{2}\right)^2 + \left(y' - \dfrac{r_{12}}{2\tan\Delta\theta}\right)^2 = R^2 \\ \dfrac{\left(x' - \dfrac{d_{12}}{2}\right)^2}{c^2 t_{12}^2} - \dfrac{y'^2}{d_{12}^2 - c^2 t_{12}^2} - \dfrac{z'^2}{d_{12}^2 - c^2 t_{12}^2} = \dfrac{1}{4} \end{cases}$$

In order to simplify solution, it is sought to determine the intersection between the iso-TDLP cylinder and the iso-TDOA hyperboloid in the constant plane z, this amounting, after the formulae for changing coordinate system, noting $C=z-z_1$, to having:

$$\frac{z_2-z_1}{d_{12}}x' + \frac{r_{12}}{d_{12}}z' = C$$

The intersection between these three geometries is now calculated. Thus, the system consisting of the 3 preceding equations is obtained, i.e.:

$$\begin{cases} z' = \dfrac{d_{12}}{r_{12}}C - \dfrac{z_2-z_1}{r_{12}}x' \\ \left(\dfrac{r_{12}}{d_{12}}x' - \dfrac{z_2-z_1}{r_{12}}C + \dfrac{(z_2-z_1)^2}{r_{12}d_{12}}x' - \dfrac{r_{12}}{2}\right)^2 + \left(y' - \dfrac{r_{12}}{2\tan\Delta\theta}\right)^2 = R^2 \\ \dfrac{\left(x' - \dfrac{d_{12}}{2}\right)^2}{c^2 t_{12}^2} - \dfrac{y'^2}{d_{12}^2 - c^2 t_{12}^2} - \dfrac{\left(\dfrac{d_{12}}{r_{12}}C - \dfrac{z_2-z_1}{r_{12}}x'\right)^2}{d_{12}^2 - c^2 t_{12}^2} = \dfrac{1}{4} \end{cases}$$

$$\Leftrightarrow \begin{cases} z' = \dfrac{d_{12}}{r_{12}}C - \dfrac{z_2-z_1}{r_{12}}x' \\ \left(\dfrac{d_{12}}{r_{12}}x' - \dfrac{z_2-z_1}{r_{12}}C - \dfrac{r_{12}}{2}\right)^2 + \left(y' - \dfrac{r_{12}}{2\tan\Delta\theta}\right)^2 = R^2 \\ y'^2 - \left(x' - \dfrac{d_{12}}{2}\right)^2 \times \dfrac{d_{12}^2 - c^2 t_{12}^2}{c^2 t_{12}^2} + \left(\dfrac{d_{12}}{r_{12}}C - \dfrac{z_2-z_1}{r_{12}}x'\right)^2 = -\dfrac{1}{4}(d_{12}^2 - c^2 t_{12}^2) \end{cases}$$

By subtracting the third equation from the second, the following is obtained:

$$-\frac{r_{12}}{2\tan\Delta\theta}\left(2y' - \frac{r_{12}}{2\tan\Delta\theta}\right) + \left(\frac{d_{12}}{r_{12}}x' - \frac{z_2-z_1}{r_{12}}C - \frac{r_{12}}{2}\right)^2 +$$

$$\left(x' - \frac{d_{12}}{2}\right)^2 \times \frac{d_{12}^2 - c^2 t_{12}^2}{c^2 t_{12}^2} - \left(\frac{d_{12}}{r_{12}}C - \frac{z_2-z_1}{r_{12}}x'\right)^2 =$$

$$R^2 + \frac{1}{4}(d_{12}^2 - c^2 t_{12}^2) \Leftrightarrow y' = a_1 x'^2 + a_2 x' + a_3$$

with:

$$\begin{cases} a_1 = \dfrac{\tan\Delta\theta}{r_{12}} \times \dfrac{d_{12}^2}{c^2 t_{12}^2} \\ a_2 = \dfrac{\tan\Delta\theta}{r_{12}} \times \left(-\dfrac{d_{12}^3}{c^2 t_{12}^2}\right) \\ a_3 = \dfrac{\tan\Delta\theta}{r_{12}} \times \left(-C^2 + C(z_2-z_1) + \dfrac{(d_{12}^2 - c^2 t_{12}^2)^2}{4c^2 t_{12}^2}\right) \end{cases}$$

The preceding system then becomes:

$$\begin{cases} z' = \dfrac{d_{12}}{r_{12}}C - \dfrac{z_2-z_1}{r_{12}}x' \\ y' = a_1 x'^2 + a_2 x' + a_3 \\ \left(\dfrac{d_{12}}{r_{12}}x' - \dfrac{z_2-z_1}{r_{12}}C - \dfrac{r_{12}}{2}\right)^2 + \left(a_1 x'^2 + a_2 x' + a_3 - \dfrac{r_{12}}{2\tan\Delta\theta}\right)^2 = R^2 \end{cases}$$

namely $$\begin{cases} b_1 x'^4 + b_2 x'^3 + b_3 x'^2 + b_4 x' + b_5 = 0 \\ y' = a_1 x'^2 + a_2 x' + a_3 \\ z' = \dfrac{d_{12}}{r_{12}} C - \dfrac{z_2 - z_1}{r_{12}} x' \end{cases}$$

with $$\begin{cases} b_1 = a_1^2 \\ b_2 = 2a_1 a_2 \\ b_3 = \left(\dfrac{d_{12}}{r_{12}}\right)^2 + a_2^2 + 2a_1\left(a_3 - \dfrac{r_{12}}{2\tan\Delta\theta}\right) \\ b_4 = -\dfrac{d_{12}}{r_{12}}\left(\dfrac{2(z_2 - z_1)}{r_{12}} C + r_{12}\right) + 2a_2\left(a_3 - \dfrac{r_{12}}{2\tan\Delta\theta}\right) \\ b_5 = \left(\dfrac{z_2 - z_1}{r_{12}} C + \dfrac{r_{12}}{2}\right)^2 + \left(a_3 - \dfrac{r_{12}}{2\tan\Delta\theta}\right)^2 - R^2 \end{cases}$$

To solve this system, it is enough to solve, via known methods, a $4^{th}$ degree polynomial equation in x of the form $$ax^4 + bx^3 + cx^2 + dx + e = 0.$$

Up to the $4^{th}$ degree, a plurality of known explicit solving methods may be used. In contrast, it is possible to show that from the $5^{th}$ degree no explicit solving method exists.

At this stage, according to the invention, a location, obtained by direct explicit calculation of the intersection of the iso-TDLP cylinder and of the TDOA hyperboloid in the 0-altitude plane, corresponding to the plane O, x, y, has been determined, for example for a point chosen to be at 100 km in the direction of the emission of the radar 1 on the plane bisecting the baseline formed by the two ESMs. Advantageously, the method according to the invention forms, on the basis of the measurements, a $4^{th}$ degree polynomial equation that is then solved using explicit methods for solving this type of equation. A plurality of known solving methods may be used, among which mention may be made of the solution of a $4^{th}$ degree equation by the Ferrari method or the solution of a $4^{th}$ degree equation by the Lagrange method.

According to the invention, the solving algorithm produced is therefore an explicit algorithm and does not use conventional gradient-based solutions, for example maximum-likelihood-estimation (MLE) algorithms.

In explicit methods, it is sought to geometrically construct the solutions as intersections of certain curves or surfaces, for example the iso-TDLP cylinder, the TDOA hyperboloid or the 0-altitude plane in the case of the invention. The solution is then obtained without iteration and without having to evaluate multiple positions: assumption of a digitized search space.

Not only is a very substantial saving in computing-power resources obtained, but in addition:
  it is possible to calculate an execution time as a function of the number of input data;
  likewise memory occupancy is predictable;
  there is no risk of divergence since the method uses a direct and non-iterative calculation.

The method according to the invention is therefore suitable for execution in real-time. Specifically, it uses an amount of memory and requires a computation time that are both predictable. It is advantageously applicable to many types of ESM measurements.

Advantageously, the error in altitude, in Z, has no influence on the iso-TDLP cylinder. It may then be advantageous to remove the variable Z from the solution by setting the value of the altitude in order to avoid artificial indeterminacy in the system of equations. Specifically, given that the error in altitude has a small influence, it may be preferable not to seek to estimate it in order to avoid this artificial indeterminacy. If it is desired to obtain a higher precision, after a location calculation estimating a first location, the altitude will be specified at this location point using an available digital model of the terrain. The method is then reiterated on the basis of this altitude using the same explicit solution according to the invention.

The measurement qualities envisioned for the TDLP measurement (precision of 1 ms) and for the TDOA measurement (precision of 10 ns) already give a precise single-measurement location. In the context of a stationary or moving target, the almost instantaneous pairwise intersection measurements of a number P of remote ESMs lead to P(P−1)/2 intersections. The exact intersections are then estimated by centroid calculation. This estimation is biased because there are only P pairs of independent measurements but in the TDLP, TDOA case the measurements are so precise that this bias is negligible. It is however possible to use the obtained estimation to initialize an asymptotically non-biased method that converges without difficulty because it is initialized very close to the actual solution.

In the context of a stationary target, and fixed ESMs, the TDLP and TDOA measurements are constants and may therefore be integrated, leading to an even higher-precision performance.

In the context of a moving target, the instantaneous locations obtained may be processed by Kalman filtering in order to estimate the movement of the target. On the basis of a calculation of position at a given time, it is thus possible to predict the positions of the target over time.

The invention has been described for TDLP measurements, quantifying time differences of passage of the emission beam 10 of the source, and for TDOA measurements, giving the time differences of arrival of the emission beam, the emission beam being intercepted by two, fixed or mobile, remote ESMs.

Other types of measurements giving information on the angle difference of arrival and on the direction of arrival of the emission beam may be used, all these measurements allowing the solution according to the invention to be geometrically constructed as the intersection of certain loci obtained on the basis of these measurements. These loci are sets of points in space that would give the same measurement if the source were located at these points. It is thus possible to construct iso-ADOA curves corresponding to points in space giving the same ADOA measurement for two receivers 21, 22, or even 0-altitude planes.

The ADOA measurement and the DOA measurement may be carried out in various ways as was indicated above.

A system implementing the method according to the invention includes at least one array of ESM sensors taking the various measurements and processing means for determining the location of a source of an electromagnetic emission on the basis of these measurements. The processing means are for example integrated into a device able to communicate with the ESM sensors. On the basis of the signals received by the sensors, the processing means determine the various angles of arrival and the directions of arrival. To this end, the signals received by the sensors are recorded, in their I and Q forms, and dated. This I and Q information and the corresponding dates are then sent to the processing device which implements the method according to the invention. This device may be carried by a vehicle or may be integrated into a ground station.

The description has been given for a system including an array of two sensors.

It is possible to produce a system reduced to a single ESM sensor. In this case:
the ADOA measurement considered is a differential measurement integrated during the movement through space of the carrier of the single ESM sensor, between two consecutive measurement positions, for example one taking into account the phase difference measured over a long interferometry baseline, i.e. an LBPDE measurement, or FDOA or TDLP measurements; and
the AOA may be a conventional angular measurement, for example obtained via an interferometer device.

The invention claimed is:

1. A method for locating a source of an electromagnetic emission on the basis of an array of ESM receivers, said source emitting an emission beam that scans space, comprising:
    a step of determining a first locus on the basis of a first measurement giving information on the angle difference of arrival of said emission beam on two receivers, said first locus including the points in space giving the same first measurement on said two receivers;
    a step of determining a second locus on the basis of a second measurement giving information on the direction of arrival on at least one receiver, said second locus including the points in space giving the same second measurement on said receiver; and
    a step of determining a third locus on which the position of said source is found, said third locus being the intersection of said first locus and of said second locus.

2. The method for locating a source of an electromagnetic emission as claimed in claim 1, comprising:
    a step of taking a measurement of the angle difference of arrival of said emission beam on two receivers, referred to as an ADOA measurement;
    a step of calculating what is referred to as an iso-ADOA cylinder on the basis of said ADOA measurement, said iso-ADOA cylinder corresponding to points in space giving the same ADOA measurement for said two receivers;
    a step of taking measurements of the time difference of arrival of said emission beam on said two receivers, referred to as TDOA measurements;
    a step of calculating what is referred to as an iso-TDOA hyperboloid on the basis of said TDOA measurements, said iso-TDOA hyperboloid corresponding to points giving said same TDOA measurements; and
    a step of calculating the intersection of said iso-ADOA cylinder and said iso-TDOA hyperboloid, said intersection comprising the position of said source.

3. The method for locating a source of an electromagnetic emission as claimed in claim 1, comprising:
    a step of taking a measurement of the time difference of passage of said emission beam over two receivers, referred to as a TDLP measurement;
    a step of calculating what is referred to as an iso-TDLP cylinder on the basis of said TDLP measurement, said iso-TDLP cylinder corresponding to points in space giving the same TDLP measurement for said two receivers;
    a step of taking measurements of the time difference of arrival of said emission beam on said two receivers, referred to as TDOA measurements;
    a step of calculating what is referred to as an iso-TDOA hyperboloid on the basis of said TDOA measurements, said iso-TDOA hyperboloid corresponding to points giving said same TDOA measurements; and
    a step of calculating the intersection of said iso-ADOA cylinder and said iso-TDOA hyperboloid, said intersection comprising the position of said source.

4. The method for locating a source of an electromagnetic emission as claimed in claim 2, wherein a given altitude being chosen, said cylinder is calculated in two dimensions, at the given altitude, said calculation corresponding to the calculation of a circle the position of said source being the intersection of said circle and said iso-TDOA hyperboloid.

5. The method for locating a source of an electromagnetic emission as claimed in claim 1, wherein the ESM sensors are borne by an aircraft.

6. The method for locating a source of an electromagnetic emission as claimed in claim 1, wherein said array includes a single ESM sensor, the measurements being carried out at two consecutive positions of said sensor.

7. The method for locating a source of electromagnetic emission as claimed in claim 1, wherein said source being mobile, the step of calculating the position of said source at a given time is followed by a step of Kalman filtering and of predicting positions of said moving target.

8. A processing device able to communicate with an array of ESM sensors, wherein it is able to implement the method as claimed in claim 1.

9. A system for locating a source of an electromagnetic emission, comprising at least one array of ESM sensors and processing means implementing the method as claimed in claim 1.

* * * * *